United States Patent [19]

Davenport

[11] 4,383,942
[45] May 17, 1983

[54] APPARATUS AND METHOD FOR ENHANCING ELECTRICAL CONDUCTIVITY OF CONDUCTIVE COMPOSITES AND PRODUCTS THEREOF

[75] Inventor: Donald E. Davenport, Palo Alto, Calif.

[73] Assignee: MB Associates, San Ramon, Calif.

[21] Appl. No.: 113,445

[22] Filed: Jan. 21, 1980

Related U.S. Application Data

[60] Division of Ser. No. 853,393, Nov. 21, 1977, Pat. No. 4,216,423, which is a continuation-in-part of Ser. No. 779,986, Mar. 22, 1977, abandoned.

[51] Int. Cl.³ .............................................. A01B 1/06
[52] U.S. Cl. ..................................... 252/512; 252/511; 252/518; 252/502; 252/506; 252/508; 252/500; 204/131; 204/144.5; 523/300

[58] Field of Search ............................. 320/1, 42, 44; 339/DIG. 3; 365/163; 252/511, 512, 518, 503, 500, 508, 502, 506; 260/37 R, 37 EP, 37 M, 37 PC

[56] References Cited

U.S. PATENT DOCUMENTS

| | | | |
|---|---|---|---|
| 3,646,305 | 2/1972 | Schmidtke et al. | 219/50 |
| 3,922,648 | 11/1975 | Buckley | 365/163 |
| 3,961,244 | 6/1976 | Minchom | 320/1 X |
| 4,243,460 | 1/1981 | Nagler | 252/512 X |
| 4,247,594 | 1/1981 | Shea et al. | 252/511 X |

Primary Examiner—J. L. Barr
Attorney, Agent, or Firm—Limbach, Limbach & Sutton

[57] ABSTRACT

Apparatus and method for enhancing the electrical conductivity of conductive composite materials and the product of the process are disclosed. An electric current is caused to flow in the composite to drive down the resistivity to levels of 10 ohm-cm or less.

45 Claims, 10 Drawing Figures

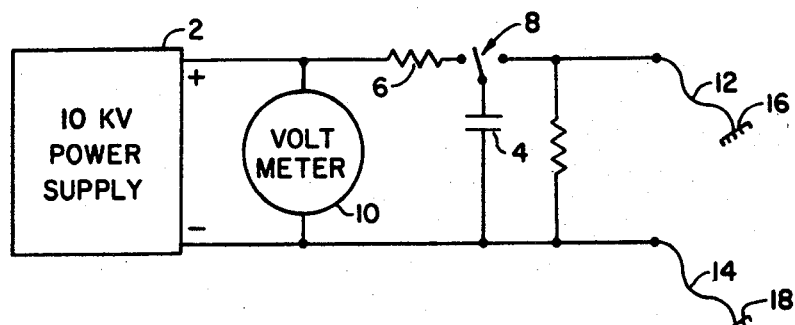
FIG._1.
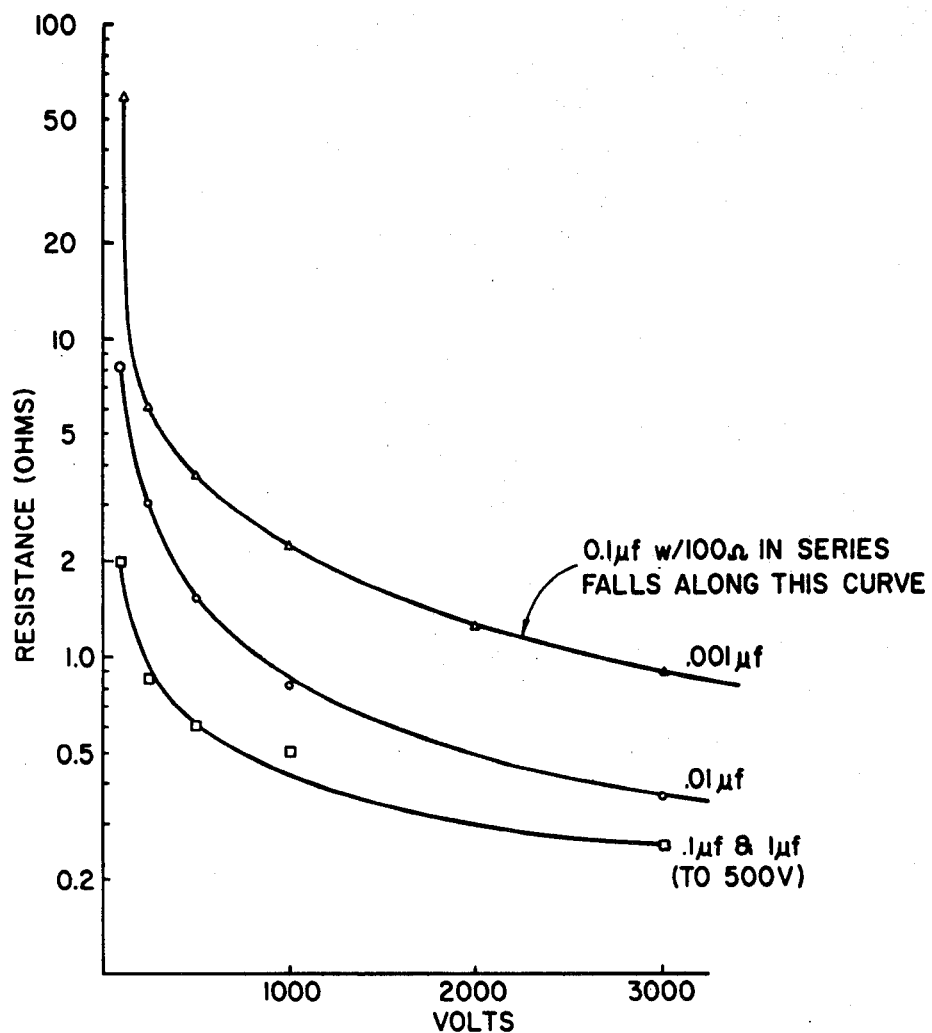
FIG._4.

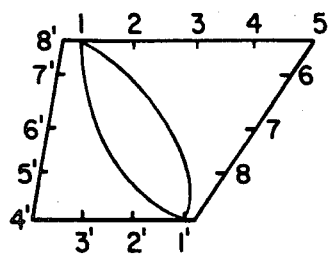
FIG._2a.
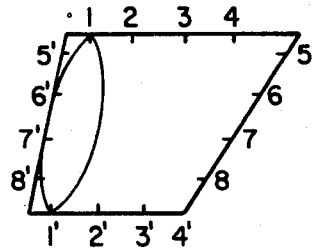
FIG._2b.
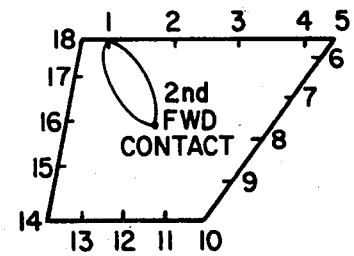
FIG._2c.
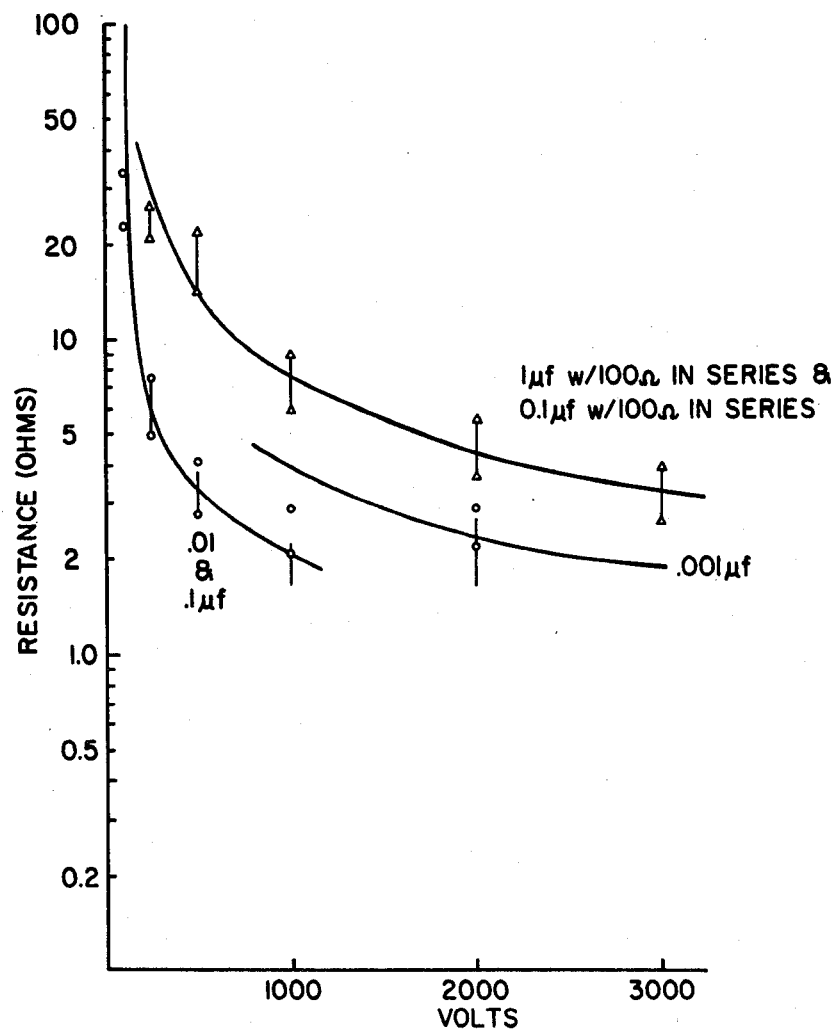
FIG._6.

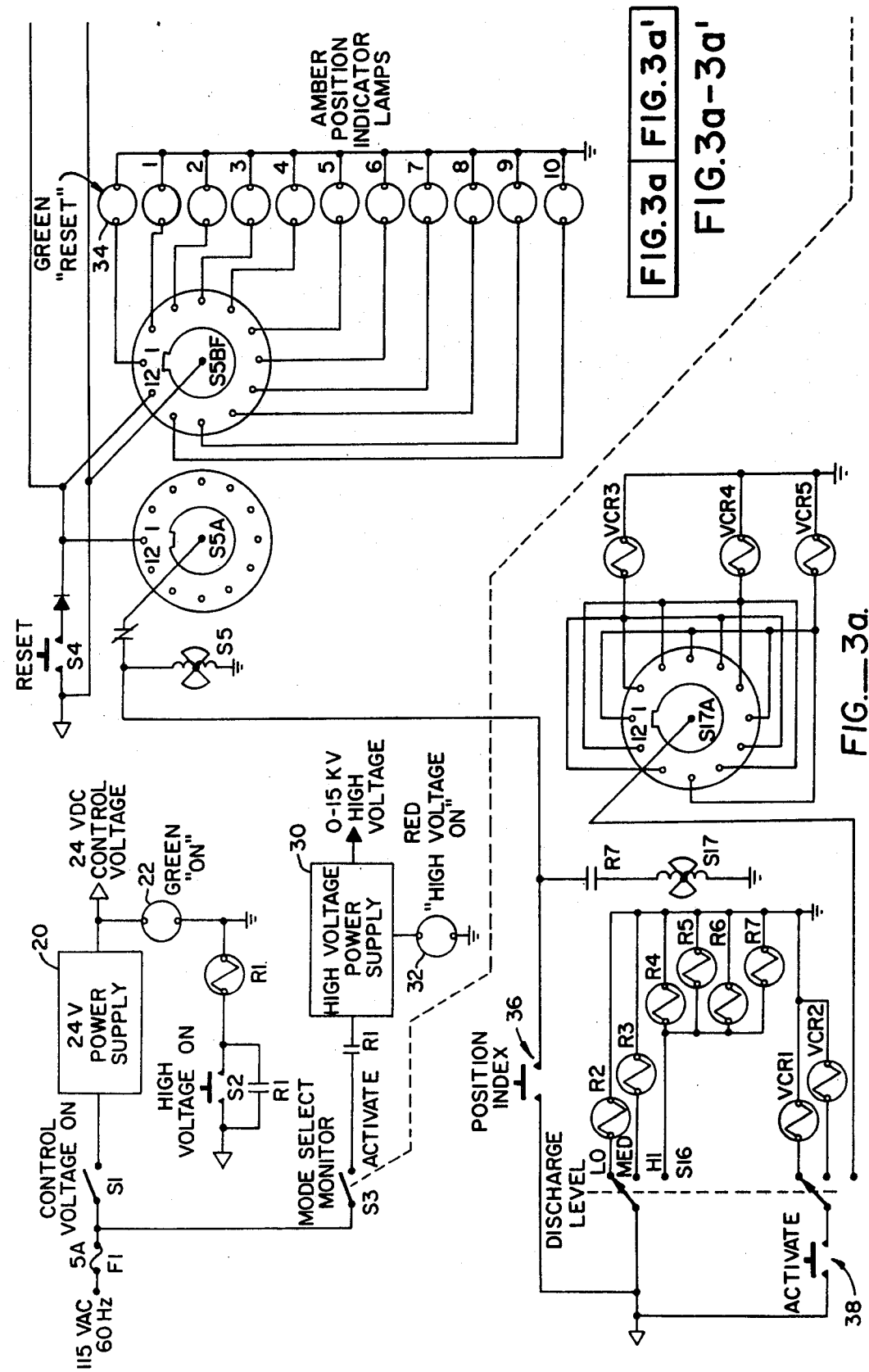

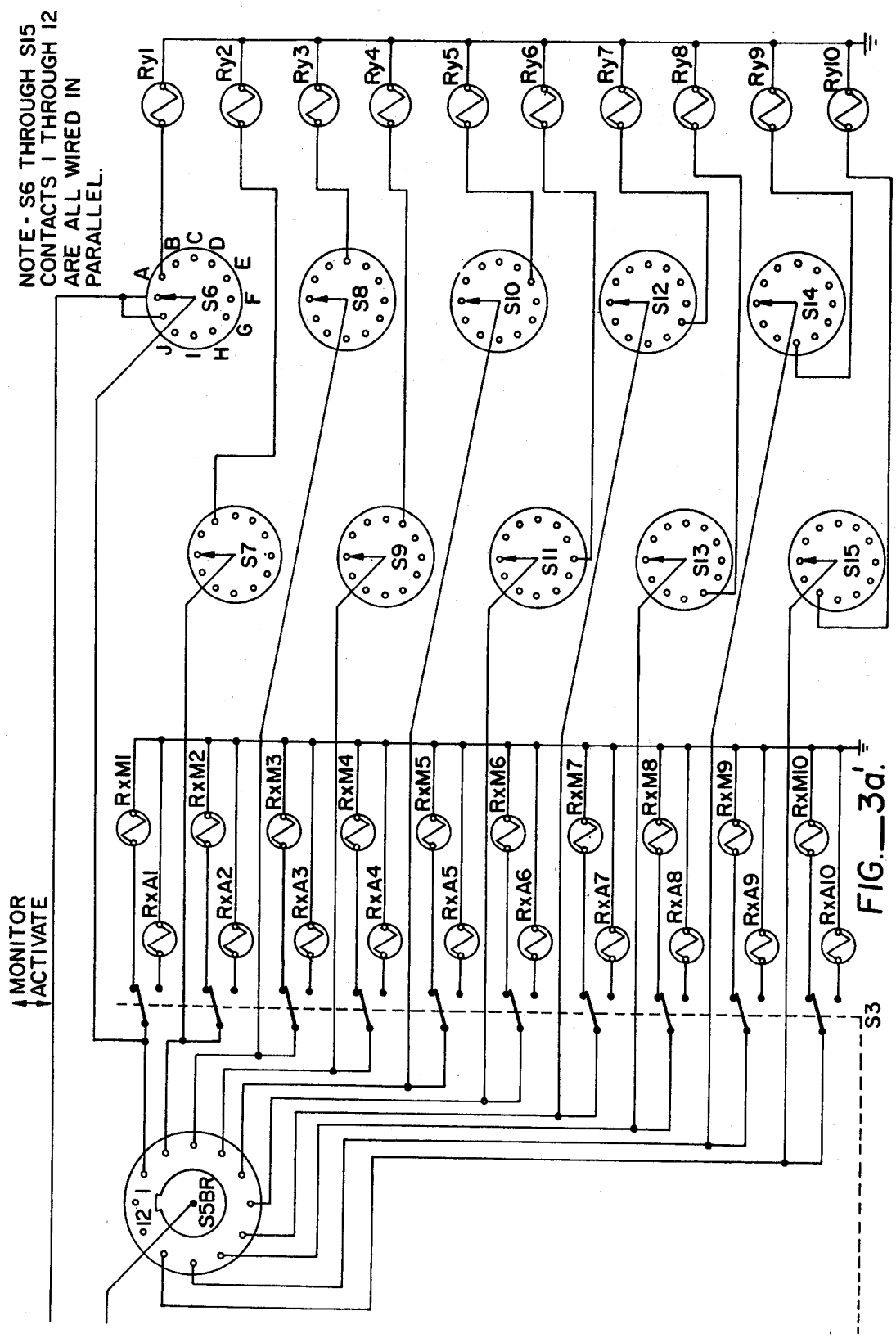

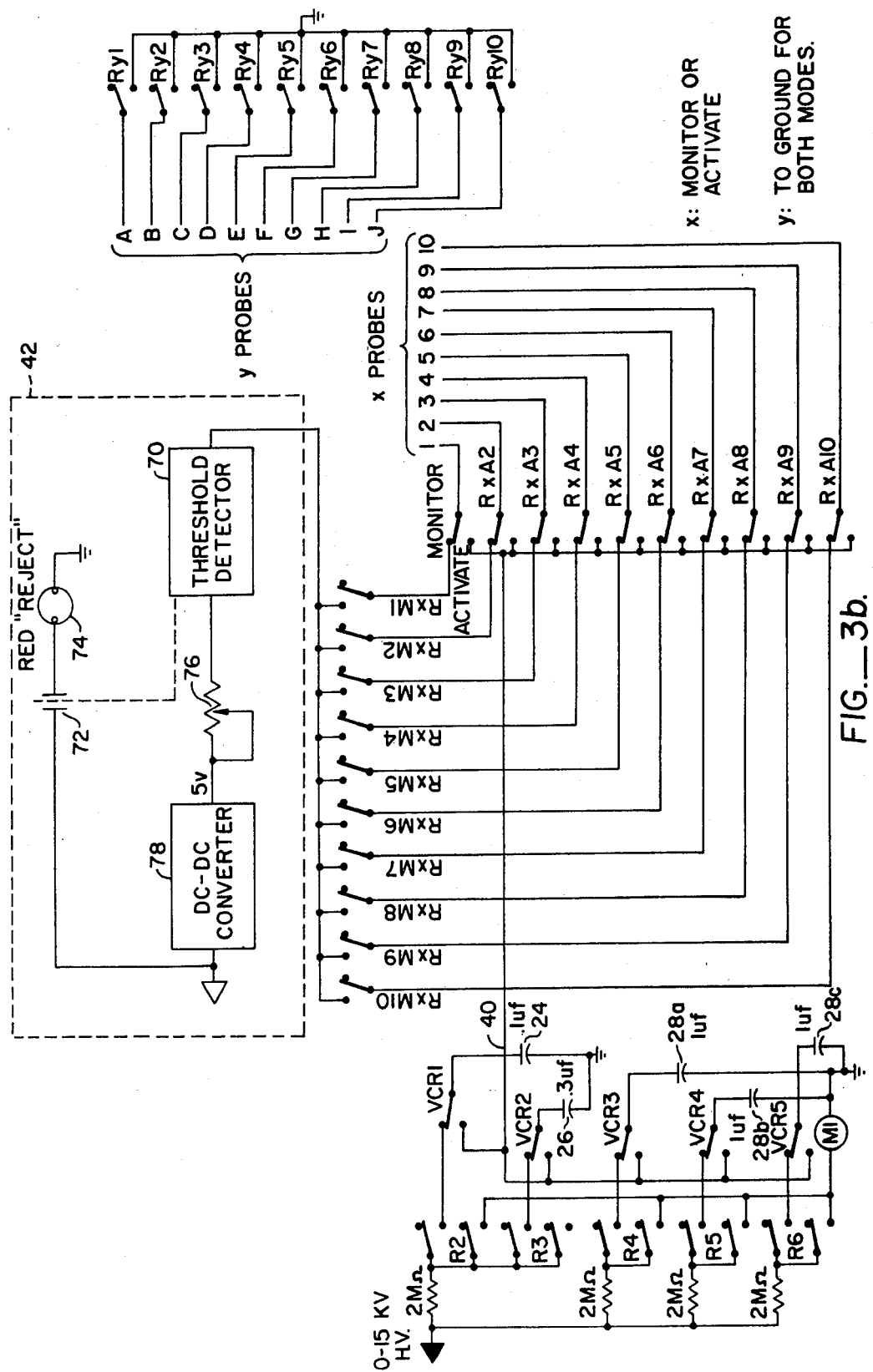
FIG._3b.

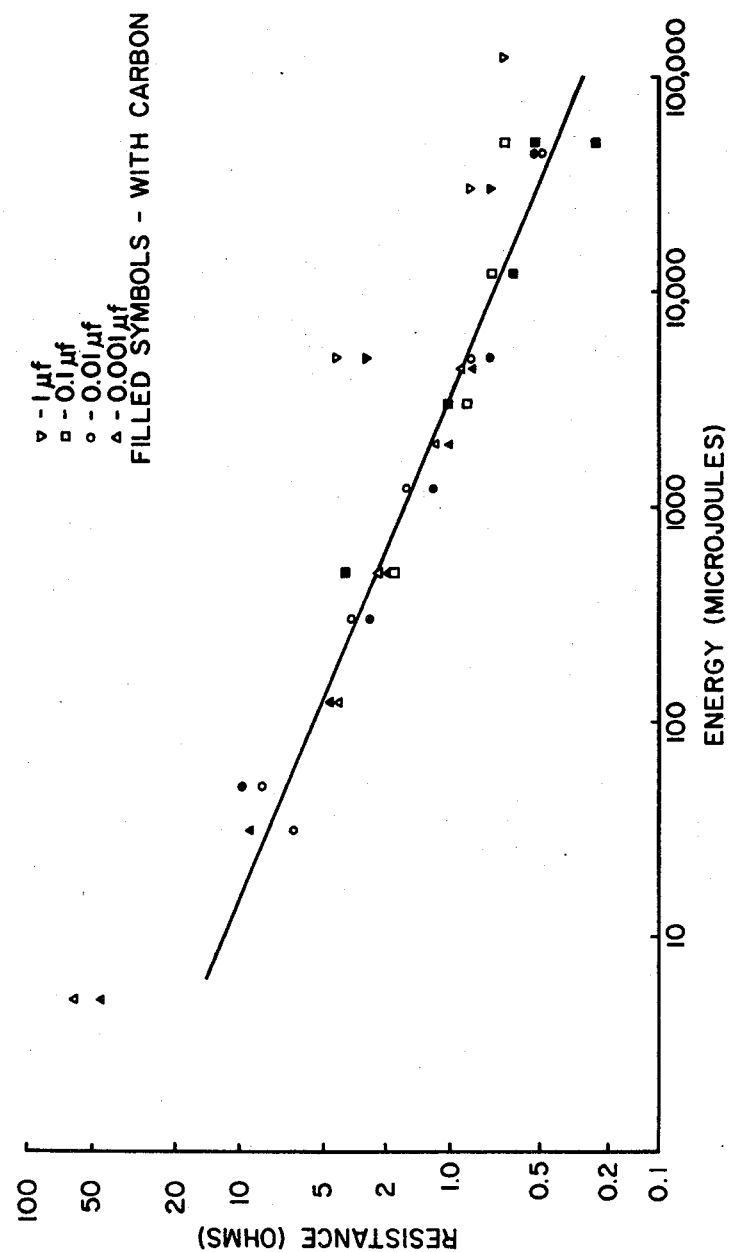
FIG._5.

APPARATUS AND METHOD FOR ENHANCING ELECTRICAL CONDUCTIVITY OF CONDUCTIVE COMPOSITES AND PRODUCTS THEREOF

This is a divisional of application Ser. No. 853,393, filed Nov. 21, 1977 now U.S. Pat. No. 4,216,423 which is in turn a continuation-in-part of application Ser. No. 779,986, filed Mar. 22, 1977, now abandoned.

BACKGROUND OF THE INVENTION

The present invention relates to electrically conductive composite materials and more particularly to apparatus and a method for increasing the electrical conductivity of composite materials and to the products of such method. While the invention relates primarily to solid or foamed resinous composites, it is believed that the principles of the invention may also be applicable to materials other than resinous materials including various other high resistivity composite material matrices such as ceramics, wood, concrete and plaster, for example.

Conductive resinous materials are well-known in the art and have been used in a variety of applications as replacements for metals and in applications uniquely adapted for plastics.

Two basic approaches are known in producing conductive resinous materials such as plastics: coating or otherwise laminating a conductive surface or layer abutting the plastic surface and impregnating the plastic with conductive materials, forming a plastic composite.

Low resitivities of from 0.01 to 1 ohm-cm have heretofore required the application of high conductivity paint coatings such as silver, the gluing of metal foils, or the plating of metal layers on the plastic surfaces. Such approaches are disadvantageous from several standpoints. The cost of the metal, particularly silver, is high as is the cost of application or deposition of the metal coating or plating. Furthermore, the resulting product has a fragile surface unsuitable for many applications. In addition, the interconnection of panels so as to maintain overall conductivity is difficult.

The impregnation of resinous materials by adding quantities of metal powders, carbon powders, metal fibers (including ribbons and other shapes) or metallized glass fibers can provide resistivities in the order of 0.01 ohm-cm to 1,000 ohm-cm if conductive material from the order of 5–80% by weight is used. Generally, the lower resistivity requires a higher proportion of conductive material which not only increases the cost of product but also may degrade the physical properties of the plastic. In addition, the use of carbon, for example, may limit the available color to black or other undesirable colors.

SUMMARY OF THE INVENTION

In accordance with the teachings of the present invention, apparatus and a method for increasing the conductivity of conductive composite materials, particularly conductive plastic composites, are disclosed, whereby the percentage weight of conductive material can be significantly reduced while maintaining the desired level of conductivity or the conductivity can be significantly increased for a particular percentage weight of conductive material.

Conductive plastic composites produced according to the inventive method are substantially more practical because the lower weight percentage of conductive material results in little or no degradation of the plastics' physical properties and/or is much less costly to produce since the plastic component is generally less expensive than the conductive impregnating material.

According to the method of the invention, one or more pulses of electric current are caused to flow through the conductive plastic composite material, the pulse having sufficient energy to permanently increase the conductivity of the plastic composite. Significant increases in conductivity have been achieved, greater than a factor of one thousand.

In a preferred embodiment, the method is practiced by a capacitor discharge system with the capacitance and charging voltage sized to appropriate values for the material being treated.

The product of the process is a highly useful high conductivity plastic composite. Potential applications for such composites are widespread for enclosures for electronic equipment where conductivity, shielding and grounding are important, including, for example, cabinetry for electronic equipment such as communications equipment, instruments and computers. It has been found that the radio frequency (RF) and electrostatic shielding capability of the plastic composite is significantly enhanced along with its conductivity, making it an attractive low cost alternative to metal enclosures. Conductive plastics are also desirable where electrostatic painting or electroplating is to be employed. The enhanced conductivity plastic composite retains the many advantages of plastic fabrication processes.

BRIEF DESCRIPTION OF THE DRAWINGS

FIG. 1 is a partially block schematic diagram showing the basic elements of a preferred embodiment for practicing the invention.

FIGS. 2a–2c is a series of schematic diagrams showing possible electrode connections on an arbitrary sized conductive composite.

FIGS. 3a' and 3b are a more detailed schematic diagram of a preferred embodiment for practicing the invention.

FIG. 4 is a series of curves showing the resistance lowering of a conductive composite in response to various capacitor discharges.

FIG. 5 is a curve showing the equal energy effects on resistance in a conductive composite.

FIG. 6 is similar to FIG. 4, showing the resistance lowering for a different type of fiber.

DETAILED DESCRIPTION

The method of the present invention relates to a wide variety of conductive resinous composite materials, such as conductive plastic composite materials where the plastics include both thermoplastics and thermosets. Examples of suitable thermoplastics include, but are not limited to polycarbonates, polyamides, acrylics, ABS's (acrylonitrile-butadiene-styrenes), polyvinyl chlorides and polyethylenes. Examples of suitable thermosets include, but are not limited to polyesters, epoxies, ureas and silicones.

Suitable conductive materials in the plastic composites include various types of metal fibers and ribbons and metal particles of various shapes, metallized glass fibers, and carbon fiber and carbon particles of various shapes. Also, metal cloths such as steel wool and aluminum wool and metal screening may also be usable. The choice of metals in wide; however, for practical reasons the choice is narrowed to inexpensive metals that have good conductivity and are easily formed. Aluminum is preferred as fitting the criteria. However, the process is applicable to composites having other metals. Likewise, metallized glass fibers are preferably coated with aluminum due to the above criteria and due to its low melting point which facilitates the manufacture. Further details of metallized glass fibers are set forth in U.S. Pat. No. 3,041,202 to H. B. Whitehurst issued June 26, 1962 and incorporated herewith by reference.

In the case of plastic composites having metallized glass fibers (MGF), the fibers are 0.1 to 10 mils in diameter and preferably in the order of 1 mil in diameter. Manufacture of MGF below 0.1 mil diameter is substantially impractical and larger than 10 mils diameter would present problems in handling the plastic composite in conventional plastic forming processes. A one mil diameter is sufficiently small so that the latter problem is overcome and yet is a size readily produced by present MGF manufacturing processes.

In the case of aluminum fibers, a ribbon having a cross-section of 0.4 mil by 4 mils is a practical size to fabricate, however, the composites used in the process are not necessarily so limited.

In the case of metal or carbon particles, a mesh size of 325 or less is a practical size to accommodate conventional plastic forming processes.

It will be understood that the particular cross-sectional shape (circular, rectangular, etc.) of the metal, MGF or carbon particle is not critical.

A preferred length for a fibrous conductive material is in the order of ¼ inch for most applications, however, any length above about 0.050" will work. Although longer fibers will tend to increase the conductivity of the material, even without regard to the present process, they nevertheless cause difficulties in handling the plastic composite in many conventional plastic processes. In certain plastic manufacturing processes, such as the sheet molding compound (SMC) process or in "spray-ups" (of fiberglass boats, for example) fiber lengths of 2-3" are commonly used. Shorter lengths than ¼ inch or so result in longer current paths between fibers or ribbons and consequently higher resistivity.

Various types or shapes of conductive materials may be used in combination. Also, amounts of nonconductive materials, such as conventional glass fiber, may also be mixed into the composite in order to achieve desired properties of strength, weight, etc.

The loading of conductive material by volume in the plastic composite is preferably in the order of 5% to 40% for fibers and particles. Volume loadings of cloth and screening may be as much as 70%. Below 5% loading by volume the inventive method may be ineffective. Fiber or particle loadings greater than 40% by volume may be workable but the cost of the composite becomes too high and the physical properties of the plastic may be degraded. Loadings are usually considered by weight rather than by volume when dealing with a particular material. A 40% volume loading in a matrix with a density of 1.5 grams/cc. corresponds approximately to a 50% weight loading of aluminum or aluminum coated metal fiber. The following examples show that a 5% loading by weight of aluminum or aluminum MFG is effective in certain composite formulations, but not in others.

In examples 1-6, the matrix density is approximately 1.48; for examples 7-9, approximately 1.5; and for example 10, the matrix density is approximately 1.0.

EXAMPLE 1

A. Urea-formaldehyde plastic (American Cyanamid W-300) (alpha cellulose filled urea-formaldehyde molding compound) dry blended with 1 mil aluminum fully coated glass fibers chopped in a kitchen type blender to an average fiber length of fifty-thousandths of an inch, dispersed throughout a 1¼" diameter pellet ¼ inch thick and molded in metallurgical press at 340° F. at 4200 psi. A pair of screws about one inch apart were driven into each of the resulting composites and measurements of resistance were made before and after passing an electric current between the screws (a) 0.2 amp from an AC source for 10-15 seconds and (b) from a 200 kilovolt one picofarad electrostatic energy system using 10-20 pulses:

| MGF Loading by Weight | Before | Resistance After 0.2 amp | After 200 KV 1Pf Discharge |
|---|---|---|---|
| 5% | $>5 \times 10^6 \Omega$ | $>5 \times 10^6 \Omega$ | $>5 \times 10^6 \Omega$ |
| 10% | 17,000Ω | 20Ω | 1.6Ω |
| 15% | 2,300Ω | 32Ω | 0.75Ω |
| 15% | 2,300Ω | 35Ω | 0.7Ω |
| 20% | 2.23Ω | 2.3Ω | 0.45Ω |
| 30% | 0.15Ω | 0.15Ω | 0.15Ω |
| 40% | 0.05Ω | .05Ω | .05Ω |

EXAMPLE 2

Same as Example 1, except that 0.4 mil×4 mil wide aluminum ribbon chopped to an average length of 50/1000 inch was used in place of MGF:

| Aluminum Loading by Weight | Resistance | | |
|---|---|---|---|
| | Before | After 0.2 Amp | After 200 KV |
| 15% | 3000Ω | 12Ω | 0.5Ω |
| 20% | 500Ω | 10Ω | 0.8Ω |

EXAMPLE 3

Same as Example 2, except that the aluminum ribbon was ¼" long:

| Aluminum Loading by Weight | Resistance | | |
|---|---|---|---|
| | Before | After 0.2 Amp | After 200 KV |
| 5% | ½Ω | <0.1Ω | <0.1Ω |
| 10% | 0.6Ω | <0.1Ω | <0.1Ω |
| 15% | 0.4Ω | <0.1Ω | <0.1Ω |

(Note: the instruments used were unable to read accurately values below 0.1Ω).

EXAMPLE 4

Same as Example 3, except that the aluminum ribbon was Alodined aluminum:

| Aluminum Loading by Weight | Resistance | | |
|---|---|---|---|
| | Before | After 0.2 Amp | After 200 KV |
| 15% | 100Ω | 0.7Ω | 0.7Ω |

EXAMPLE 5

Same as Example 1, except half coated aluminum MGF (i.e., aluminum coating over ½ the periphery was used):

| MGF Loading | Resistance | | |
|---|---|---|---|
| by Weight | Before | After 0.2 Amp | After 200 KV |
| 20% | >5 × 10⁶Ω | >5 × 10⁶Ω | 75Ω |
| 40% | in megohms | 2–3Ω | 1.7Ω |
| 50% | " | 2–3Ω | 0.8Ω |
| 55% | " | 2–3Ω | 0.8Ω |

EXAMPLE 6

Metallized glass fiber (aluminum coated, 1 mil diameter ⅛" to ¼" length) was substituted for an equal weight of nonconductive glass fiber in a standard resin bulk molding compound, of the type used for making cabinets. The nonconductive plastic composite before substitution of 10% MGF by weight was substantially as follows: 25% resin, 25% glass fibers, 50% filler (limestone, etc.). The molding compound was pressed into plates 6"×6"×⅛" thick. Screws were driven into the four corners. A 3 kilovolt charge on a 0.1 mfd. capacitor was discharged 10 times through the material:
Sample 1
 resistivity dropped from 90 Ωcm to 13 Ωcm.
Sample 2
 resistivity dropped from 325 Ωcm to 30 Ωcm.

EXAMPLE 7

Same as Example 6, except with 10% aluminum ribbon (0.4×4 mil, ⅛" to ¼" length) for an equal weight of nonconductive glass fiber:
Sample 1, ⅛" thick panel.
 resistivity dropped from 56 Ωcm to 0.18 Ωcm.
Sample 2, ⅛" thick panel.
 resistivity dropped from 28 Ωcm to 0.1 Ωcm.
Sample 3, ¼" thick panel.
 resistivity dropped from 3.8 Ωcm to 0.23 Ωcm.

EXAMPLE 8

Same as Example 7, except with an amount of carbon as a part of the filler.

| | Resistivity | |
|---|---|---|
| | Before | After |
| Sample 1 | 75Ω cm | 0.1Ω cm |
| Sample 2 | 32Ω cm | 0.1Ω cm |
| Sample 3 | 54Ω cm | <0.1Ω cm |

EXAMPLE 9

Same as Example 8, except different carbon filler.

| | Resistivity | |
|---|---|---|
| | Before | After |
| Sample 1 | 63Ω cm | 0.1Ω cm |
| Sample 2 | 125Ω cm | <0.1Ω cm |
| Sample 3 | 45Ω cm | <0.1Ω cm |

EXAMPLE 10

Isophthalate polyester resin blended by hand with ¾" length 1.0 mil diameter fully coated aluminum MFG and compression molded into 6" square plaques, 0.10" to 0.15" thick. A 3 kilovolt charge on a 0.1 mfd capacitor was discharged 10 times through the material.

| | Resistivity | |
|---|---|---|
| | Before | After |
| 23% MGF by Weight | | |
| Sample 1, 1/10" thick | 74Ω cm | <0.1Ω cm |
| Sample 2, 1/10" thick | 41Ω cm | 0.1Ω cm |
| 31% MGF by Weight | | |
| Sample 1, ⅛" thick | 62Ω cm | <0.1Ω cm |
| Sample 2, 1/10" thick | 18Ω cm | <0.1Ω cm |
| 40% MGF by Weight | | |
| Sample 1, 0.15" thick | 0.9Ω cm | 0.1Ω cm |
| Sample 2, 0.15" thick | 0.6Ω cm | 0.1Ω cm |

Tests were run to determine the RF shielding capabilities of the samples of Example 10 using an electromagnetic plane wave input to the sample and measuring transmission loss through the sample in decibels at 100, 250, 500, and 1,000 MHz.

| | 100 MHz | 250 MHz | 500 MHz | 1000 MHz |
|---|---|---|---|---|
| 23%/s.1 before | 21db | 23 | 26 | 27 |
| 23%/s.1 after | 41 | 36 | 32 | 28 |
| 23%/s.2 before | 22 | 25 | 26 | 29 |
| 23%/s.2 after | 44 | 39 | 35 | 32 |
| 31%/s.1 before | 17 | 21 | 23 | 23 |
| 31%/s.1 after | 46 | 40 | 34 | 30 |
| 31%/s.2 before | 20 | 24 | 25 | 26 |
| 31%/s.2 after | 40 | 34 | 29 | 28 |
| 40%/s.1 before | 32.5 | 33 | 36 | 41 |
| 40%/s.1 after | 51 | 46 | 43 | 43 |
| 40%/s.2 before | 35 | 36 | 38 | 40 |
| 40%/s.2 after | 51 | 48 | 44.5 | 38.5 |

Although the exact physical process occurring in the conductive plastic composite as a result of the present process is not fully understood, it is believed that current paths between the conductive materials are increased in number and enhanced. In conventional conductive plastic composites a relatively high conductive material loading is required to assure that continuous low resistance paths are formed by touching or at least by very closely spaced conductive particles, fibers or ribbons (additives). As the concentration of conductive additives increases, the resistivity decreases. The present process may lower the resistivity by carbonizing the paths between the conductive additives and/or melting the conductive additive interfaces thus causing them to weld together. Other unknown phenomena may be involved. There is some evidence that the tendency of the plastic to break down under high voltage and form conducting tracks may have significance, which suggests that a carbonizing of the paths between additives is occurring. Certain modifications of the plastic formulation may also enhance the susceptibility of the plastic to increased conductivity when the present process is applied.

The present process appears to lower the resistance of already existing contacts between conductive additives and to create new contacts between additives that are very close together to create a network of conductors. Optimally, the energy applied is sufficient to enhance existing contacts and near contacts without burning out connections or destroying the conductive additives.

It is noted that the use of DC or 60 cycle AC current seems to be less effective than a capacitor discharge pulse in driving the resistivity below 10–20 ohm-cm. Similarly, a voltage of 1500 V on the 0.1 mfd capacitor was less effective than 3000 V in lowering the resistivity.

In the case of a thin 6 inch square sheet of conductive plastic composite material where screws were driven into points near the four corners, the best uniformity in driving down the resistivity was obtained by applying the high electric current between each combination of screw pairs.

FIG. 1 shows a diagram of the basic elements of a capacitor discharge apparatus suitable for use in practicing the invention. While the apparatus will be described with reference to enhancing the conductivity of plastic composites, it will be understood that other materials may be suitable as set forth above. A high voltage power supply 2, capable of providing on the order of 10 kilovolts DC, has one output lead connected to one side of capacitor 4, which has a capacitance of about 0.1 microfarads, for example. The power supply voltage can be adjustable. The other power supply output lead is connected to a charging resistor 6 which is connectable to the other side of capacitor 4 by a single pole double throw switch 8. Resistor 6 can have a value of one megohms, for example. In the left-hand switch position, capacitor 4 charges to the supply voltage according to the RC time constant. A voltmeter 10 across the power supply leads permits monitoring of the capacitor charging voltage. In the right-hand switch position, the capacitor 4 is connected to a pair of leads 12 and 14 terminating in contacts 16 and 18. A bleeder resistor, having a value of one megohm, for example, is also connected across the leads 12 and 14.

The contacts 16, 18 and leads 12, 14 must be capable of transferring energy in the form of high frequency pulses and yet be simple to connect and disconnect from the plastic composite. In order to increase the probability that the applied pulse is carried by more than one conductive fiber, thereby decreasing the likelihood of burnout, the contacts should have about 3 to 10 teeth over an area in the order of $\frac{1}{8}$ inch$^2$ capable of penetrating the composite surface by about 1 to 5 mils.

The contacts should be applied sequentially to a multiplicity of points on the surface of the composite to provide a uniformly low resistivity throughout the area of the surface. Preferably, the contacts are connected at natural boundaries of the surface, spaced on the order of two to twenty inches, to form a network through the composite. Contacts could be molded into the composite or removable contact "ears" could be provided. Because the electric field is concentrated in the region of the electrodes and fans out in the adjacent area, the electrodes should be sequentially attached at spacings on the order of one to three inches along the surface boundaries to assure an effective network of paths. Possible connection patterns are shown in FIGS. 2a, 2b and 2c for an arbitrarily shaped composite. In FIG. 2c, one contact is maintained in the center of the composite while the peripheral contacts are moved sequentially. The oval patterns in the Figures illustrate possible electric field patterns between a particular pair of contacts.

Alternatively, in lieu of manual movement of contacts, a multiplicity of contacts fixed in a jig to fit a particularly sized composite part can be activated a pair at a time by automatic or semiautomatic means.

The selection of capacitor size and voltage applied will depend on the part size and shape, the spacing of the electrodes, the characteristics of the composite and conductive additive and the concentration thereof. Short high voltage pulses are more effective than long low voltage pulses so that energy flow from the conductive additive path to the surrounding matrix is limited. It is believed that for best efficiency the RC time constant of the discharge circuit should be less than about ten microseconds.

A typical energy requirement for electrodes spaced two inches on a plastic composite containing 10% by weight fully aluminum coated glass fiber (1 mil diameter, $\frac{1}{8}$" to $\frac{1}{4}$" length) is in the order of 0.01 joules and increases somewhat faster than the separation distance of the electrodes; for a six inch spacing the energy requirement is in the order of 0.05 joules.

A single pulse at each pair of connections appears to accomplish about 80% of the resistance reduction that can be attained, while 2 or 3 pulses provide essentially the same maximum resistance reduction as can be attained with 10 or more pulses.

Too large an energy pulse per unit volume of additive degrades the conductive additives in the electrode contact region by melting the additive and opening the circuits near the contact point before the remainder of the path can be fully attained. What constitutes too large a pulse depends in part on the effectiveness with which the contact electrodes couple to multiple conductive additive paths. At the extreme, contact with only a single conductive fiber requires it to carry the entire pulse. A one mil diameter fully aluminum coated glass fiber burns out at about 0.01 joules/cm and a 4 mil by 0.4 mil cross section aluminum ribbon burns out at about 0.06 joules/cm. Thus, it is important that electrode contact with multiple fibers is effected if larger energies than these are used. With multiple fiber electrode contact, the following are recommended maximum applied energies:

| Contact Spacing (inches) | 4 mil × 0.4 mil Aluminum Ribbon | | | 1 mil fully Aluminum Coated Glass Fiber | | |
|---|---|---|---|---|---|---|
| | Energy Joules | Cap. μf | Charge Volts | Energy Joules | Cap. μf | Charge Volts |
| 2 | 0.05 | 0.1 | 1000 | .012 | 0.1 | 500 |
| 6 | 0.20 | 0.1 | 2000 | 0.05 | 0.1 | 1000 |
| 12 | 0.45 | 0.1 | 3000 | 0.11 | 0.1 | 1500 |

It appears that the maximum energy limit is determined by the fiber characteristics and volume and is independent of the plastic in which it is held, whereas, the lower energy limit to achieve any resistance enhancement appears to be dependent on the plastic characteristics.

After completing the connection and discharge pattern, the resistance between selected points is checked to assure that a uniform lowering of resistance has been obtained.

By varying electrode spacings and pulse energy and subsequently measuring resistance in several substantially identical pieces, an optimum identification of electrode locations and energy can be derived for use with pieces of the same or similar shape and composition.

FIGS. 3a and 3b show a more eleborate apparatus for sequentially discharging a capacitor through a series of selected paths. The discharge path can be selected to sequentially output on up to ten lines and return on selected paired ones of up to ten lines. Following up to ten discharge cycles, the unit is reset and the resistance of each of the previous discharge paths is monitored for operator classification as pass or reject.

Tex X probes (1–10) and ten Y probes (A–J) are connected to suitable electrodes for attachment to a workpiece to be processed in accordance with the inventive method. The number of discharge cycle probe pairs and the X-Y probe pairings are selected by the matrix select switches S6-S15. For example, if five discharge cycles are desired with probe pairings 1 to C, 2 to A, 3 to J, 4 to B and 5 to B, S6 through S10 would be set at C, A, J, B and B, respectively. The manner in which S6-S15 control the number of discharge cycles and the probe pairings for those cycles is further explained below.

After attaching the probes and setting S6-S15, the control voltage switch S1 is turned on to activate the low voltage (24 volt, for example) control voltage supply 20 which lights a green "on" lamp 22. A low, medium or high discharge level is selected by S16 to apply the control voltage to the relay windings R2, R3 or the group of R4-R7, respectively, to close the associated relays, thereby arming the selected capacitor(s) for charging when high voltage is available and the selected vacuum relay VCR1-VCR5 is closed. The low, medium and high capacitors 24, 26 and 28a, b, c and 0.1 $\mu$f, 0.3 $\mu$f and 1 $\mu$f, respectively. Three high capacitors (1 $\mu$f) are used to minimize charge waiting time between discharges. All three are charged simultaneously, but discharged separately by relay R7 and stepper switch R17.

The adjustable 0–15 kilovolt high voltage supply 30 is energized by depressing the high voltage "on" button S2 that energizes the R1 relay winding to apply the AC line voltage to the high voltage supply 30 and to close the S2 path to maintain the relay R1 closed when S2 is released. A red high voltage "on" lamp 32 lights and meter M1 reads the charging voltage on the selected capacitor(s). When the chosen voltage charge is reached, the reset button S4 is pressed and held to cause stepper solenoid switch S5 to return to position 1 (reset) and light the green lamp 34.

Next, the position index push button 36 is pressed and released to step solenoid S5 to position 1 thus lighting the amber position 1 indicator lamp to indicate that the first X probe and the Y probe selected by S6 will be active in the first discharge cycle. The system is now armed and ready to discharge the charged capacitor through the first X probe and the selected Y probe.

The activate push button 38 is depressed and held briefly to apply the control voltage to the selected vacuum relay, thereby applying the capacitor voltage via line 40 to X probe 1 through relay RXA2. The latter relay is in the lower position under the control of S5, S2 and the RXA1 winding. At the same time, the selected Y probe pair is grounded via one of RY1–RY10 depending on the setting of S6–S15.

The index push button 36 and activate push button 38 are sequentially pressed to discharge the capacitor through each probe pair until the green reset lamp 34 illuminates, indicating the end of a set of discharge cycles.

Next, the mode select switch S3 is placed in the monitor position, arming the RXM1-10 relay windings so that the selected X probe is connected to a resistance monitoring circuit 42.

A monitoring circuit 42 includes a threshold detector 70 that closes relay 72 to light reject lamp 74 when a selected probe resistance is higher than that of a threshold resistance. The threshold resistance is set by a potentiometer 76 which has 5 volts applied from DC-DC converter 78. Each probe pair resistance is checked by pressing the position index push button 36 to sequentially connect the previously chosen probe pairs to the monitoring circuit 42.

Upon satisfactory checking of the probe pair resistances the probes and connectors can be removed from the workpiece.

In order to determine the optimum combination of capacitance and voltage for a particular conductive composite, tests were run with plates made from BMC (polyester bulk molding compound) containing 10% by weight chopped aluminum ribbon filler (4 mil×0.4 mil with lengths of $\frac{1}{8}''$ to $\frac{1}{4}''$). Tests were carried out on two inch square plates with screws inserted into the four corners for electrical contacts. To test scaling of electrode distance, plates six inches square were also evaluated. Apparatus of the type of FIG. 1 was used and several pulses were applied across the two sets of diagonal corners. The voltage is roughly directly proportional to distance.

FIG. 4 shows three curves plotting resistance against voltage for several different capacitor values. The upper curve is for a 0.001 $\mu$f capacitor and also a 0.1 $\mu$f capacitor with a 100 ohm resistor in series. The latter configuration shows the discharge time, illustrating the importance of a short pulse. The center curve is for the 0.01 $\mu$f capacitor case. In the lower curve, data for the 0.1 $\mu$f capacitor and a 1 $\mu$f capacitor (up to 500 V) are plotted. Above 500 volts, the energy in the 1 $\mu$f capacitor was so great as to increase the resistance instead of decreasing it.

In FIG. 5, capacitor energy versus resistance was plotted for the data of FIG. 4. Darkened symbols indicate test plates which included impregnated carbon. The data appears to fall fairly well along a straight line, indicating that the resistance reduction is proportional to the amount of energy of each pulse at least within certain upper and lower limits as mentioned above.

In FIG. 6, a further set of data is shown for the same test apparatus and procedure but with plates made from BMC with 10% by weight fully aluminum coated chopped glass fiber (1 mil diameter) ($\frac{1}{8}''$ to $\frac{1}{4}''$ long). The upper curve shows the data for a 1 $\mu$f capacitor with 100 ohms in series and for a 0.1 $\mu$f capacitor with 100 ohms in series. The middle curve is for the case of a 0.001 $\mu$f capacitor and the lower left curve is for the cases of 0.01 and 0.1 $\mu$f capacitors. These curves illustrate that this type of fiber burns out at lower energy levels than does the 0.4 mil×4 mil pure aluminum fiber.

Various modifications to the preferred embodiments will be apparent to those of ordinary skill in the art. The invention is thus to be limited only by the scope of the claims.

I claim:
1. A method of increasing the conductivity of a plurality of articles, each article substantially identically shaped and is of a composite material containing at least 5% electrically conductive additives by volume dispersed throughout the composite material, said method comprising,
   attaching connectors in pairs to sets of selected locations in the surface of said material,
   passing at least one electrical pulse through the pair of connectors and composite material at each set of selected locations,
   measuring the resistance of said composite material at each set of selected locations, adjusting the parameters of energy and of the number of electrical pulses at each set of selected locations to optimize the conductivity of said composite material, and selecting the optimized parameters to increase the conductivity of subsequently treated substantially identically shaped articles of said composite material.

2. A method for increasing the conductivity of a conductive resinous composite material containing at least 5% electrically conductive additives by volume dispersed throughout the composite material comprising discharging at least one short high voltage pulse through at least a portion of said material, said pulse having a discharge time constant of 10 microseconds or less, whereby current paths among said conductive additives are increased in number and enhanced.

3. The method of claim 2 wherein said conductive additives comprise conductive fibers having a range of diameters 0.1 to 10 mils.

4. The method of claim 2 wherein the conductive additives comprise metal ribbon having a length in the order of 0.050 inches or longer.

5. The method of claim 3 wherein the conductive fibers have a length in the order of 0.050 inches or longer.

6. The method of claim 3 wherein the conductive fibers are metallized glass fibers.

7. The method of claim 6 wherein the metallized glass fibers are substantially fully coated with aluminum.

8. The method of claim 6 wherein a portion of the peripheries of the metallized glass fibers are coated with aluminum.

9. The method of claim 4 wherein the percentage by volume of electrically conductive ribbon ranges to 40%.

10. The method of claim 2 wherein the resinous composite material comprises plastics from the group of thermoplastics and thermosets.

11. The method of claim 2 wherein the percentage by volume of electrically conductive additives ranges to 40%.

12. The method of claim 6 wherein the resinous composite further includes nonmetallized glass fibers dispersed throughout the composite material.

13. The method of claim 7 wherein the resinous composite further includes nonmetallized glass fibers dispersed throughout the composite material.

14. The method of claim 2 wherein the composite material comprises at least 5% by volume electrically conductive additives from the group of metals, metallized glass fibers and carbon.

15. The method of claim 1 wherein the composite material comprises materials from the group of thermoplastics, thermosets, ceramics, woods, concretes and plasters.

16. The product of the process of claim 2.
17. The product of the process of claim 3.
18. The product of the process of claim 5.
19. The product of the process of claim 6.
20. The product of the process of claim 7.
21. The product of the process of claim 8.
22. The product of the process of claim 4.
23. The product of the process of claim 9.
24. The product of the process of claim 10.
25. The product of the process of claim 11.
26. The product of the process of claim 12.
27. The product of the process of claim 13.
28. The product of the process of claim 14.
29. The product of the process of claim 15.

30. A method for increasing the conductivity of a conductive resinous composite material containing at least 5% electrically conductive additives by volume dispersed throughout the composite material comprising passing at least one short high voltage alternating current pulse through at least a portion of said material, whereby current paths among said conductive additives are increased in number and enhanced.

31. The method of claim 30 wherein said conductive additives comprise conductive fibers having a range of diameters 0.1 to 10 mils.

32. The method of claim 30 wherein the conductive fibers have a length in the order of 0.050 inches or longer.

33. The method of claim 32 wherein the conductive fibers are metallized glass fibers.

34. The method of claim 30 wherein the conductive additives comprise metal ribbon having a length in the order of 0.050 inches or longer.

35. The method of claim 34 wherein the metal ribbon is aluminum.

36. The method of claim 30 wherein the percentage by volume of electrically conductive additives ranges to 40%.

37. The method of claim 33 wherein the resinous composite further includes nonmetallized glass fibers dispersed throughout the composite material.

38. The product of the process of claim 30.
39. The product of the process of claim 31.
40. The product of the process of claim 32.
41. The product of the process of claim 33.
42. The product of the process of claim 34.
43. The product of the process of claim 35.
44. The product of the process of claim 36.
45. The product of the process of claim 37.

* * * * *